United States Patent [19]

Anders et al.

[11] 4,227,300
[45] Oct. 14, 1980

[54] METHOD FOR THE ELECTRICAL BONDING OF THIN FILM TANTALUM CAPACITOR NETWORKS TO OTHER NETWORKS

[75] Inventors: Wilfried Anders, Riemerling; Werner Piepenburg, Munich, both of Fed. Rep. of Germany

[73] Assignee: Siemens Aktiengesellschaft, Munich, Fed. Rep. of Germany

[21] Appl. No.: 943,151

[22] Filed: Sep. 18, 1978

Related U.S. Application Data

[63] Continuation of Ser. No. 670,900, Mar. 26, 1976, abandoned.

[30] Foreign Application Priority Data

Mar. 27, 1975 [DE] Fed. Rep. of Germany ....... 2513859

[51] Int. Cl.³ .......................... H05K 3/34; H05K 3/36
[52] U.S. Cl. ...................... 29/830; 29/840; 29/843
[58] Field of Search .................. 29/626, 628, 25.42; 361/305, 322, 412, 414; 228/199, 180, 203, 211, 259

[56] References Cited

U.S. PATENT DOCUMENTS

| 2,756,485 | 7/1956 | Abramson et al. | 29/626 |
| 3,723,838 | 3/1973 | Kumagai | 361/322 |
| 3,786,323 | 1/1974 | Peters et al. | 361/322 |
| 3,859,722 | 1/1975 | Kinsky et al. | 29/626 |

*Primary Examiner*—Carl E. Hall
*Attorney, Agent, or Firm*—Schuyler, Birch, McKie & Beckett

[57] ABSTRACT

A method for electrically bonding tantalum thin film capacitor networks to other networks is described. A first non-conducting support member has a thin film tantalum capacitor mounted thereon. A second non-conducting support member has another component such as a resistor mounted thereon. The two non-conducting support members are placed in a back-to-back position so that the thin film tantalum capacitor and the other component are remote from each other. These two non-conducting support members are then bound together and dipped into a molten solder bath to form a solder coating on the metal elements of the completed network.

1 Claim, 4 Drawing Figures

METHOD FOR THE ELECTRICAL BONDING OF THIN FILM TANTALUM CAPACITOR NETWORKS TO OTHER NETWORKS

This is a continuation of application Ser. No. 670,900 filed Mar. 26, 1976, now abandoned.

BACKGROUND OF THE INVENTION

This invention relates to a method for the electrical bonding of thin film capacitors or thin film capacitor networks of tantalum to other electrical components, for example, to resistor networks.

In networks of the foregoing type it is known to use a nonconducting support for the capacitor. The support is provided with a thin film electrode (base electrode) of tantalum on which thereafter is grown in a selected region a tantalum pentoxide film having dielectric properties. The dielectric is covered with another electrically conducting film constituting an opposing electrode.

For the economical production of thin film components in tantalum technology it is well known in the art to produce on separate substrates of glass or similar insulators resistor and capacitor networks, interconnecting them thereafter.

However, the capacitors normally produced using beta-tantalum thin film technology are highly sensitive to high temperatures, which considerably degrade the electrical properties of capacitors so produced. Accordingly, relatively complex methods are necessary for the bonding of the capacitors such as gold wire bonding and selective soldering. Dip soldering such as performed in tantalum thin film technique cannot be employed in the known thin film capacitors made of beta-tantalum without altering or degrading their characteristics.

Accordingly, it is an object of this invention to provide a method of bonding tantalum thin film capacitors or tantalum thin film capacitor networks to other electrical components which is distinguished from the above discussed prior art methods by its great simplicity and which, moreover, provides optimum protection for the thin film capacitors against environmental hazards.

SUMMARY OF THE INVENTION

These and other objects of this invention are achieved in that the thin film electrode of tantalum mentioned initially is doped with nitrogen and that the thin film electrode and at least the film having the dielectric properties are both subjected to tempering. The resulting nitrogen content is in a range the lower limit of which is higher than for beta-tantalum and the upper limit lower than for tantalum nitride. The thin film capacitor or capacitors thereafter are completely dipped together with the aforementioned electrical components into a molten solder bath.

Using this method the contact areas, all the conductors and all the opposing electrodes of the capacitors receive a highly conductive solder coating. Moreover, the resistance of the conductor tracks is reduced, resulting in the complete elimination of undesired voltage coupling of the conductor tracks. At the same time, the solder layer provides mechanical protection for the capacitors, so that subsequent processes such as balancing of the circuit are facilitated and final encapsulation with plastic material is simplified. In addition, the solder layer provides protection against moisture, since the dielectric is hermetically closed so that the life of such capacitors is lengthened considerably and the quality is generally improved.

BRIEF DESCRIPTION OF THE DRAWINGS

The principles of this invention can be best understood by reference to a description of a preferred embodiment given below and the drawings which are briefly described as follows.

DETAILED DESCRIPTION OF THE PREFERRED EMBODIMENT

Figure 1:
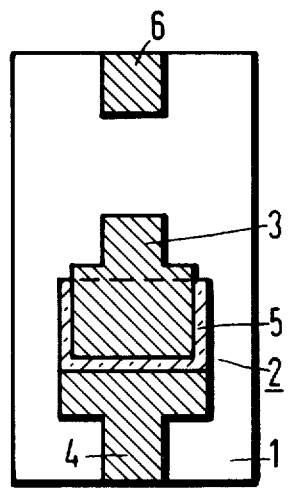
FIG. 1 is a top view of one side of the capacitor portions of a RC thin film network constructed according to the invention.

The capacitor portion of an RC thin film circuit constructed according to the invention is illustrated in FIG. 1 and includes a thin film capacitor 2 mounted on a substrate 1; the electrodes of the capacitor are marked 3 and 4 and the dielectric 5. Furthermore, a conductor track 6 can be seen on substrate 1. The base electrode 4 of the capacitor is made of a layer of alpha-tantalum 4a which is doped with nitrogen and a conductor track 4b. The completed capacitor was subjected to tempering (e.g., 2 hours at 250° C.).

Figure 2:
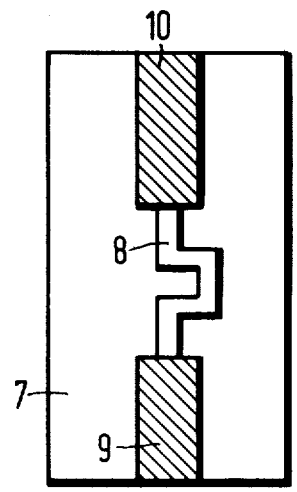
FIG. 2 is a top view of one side of the resistor portion of the aforementioned network.

The illustration of FIG. 2 shows on another substrate 7 a resistor 8 produced by known thin film techniques. The electric connection terminals of the resistor are marked 9 and 10.

Figure 3:
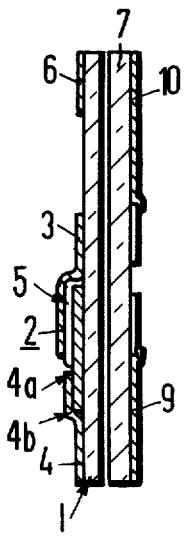
FIG. 3 is an end cross-sectional view showing the thin film circuits in FIGS. 1 and 2 joined together.

FIG. 3 is a cross-sectional view of the component parts shown in FIGS. 1 and 2, and illustrates them in a connected relationship.

Figure 4:
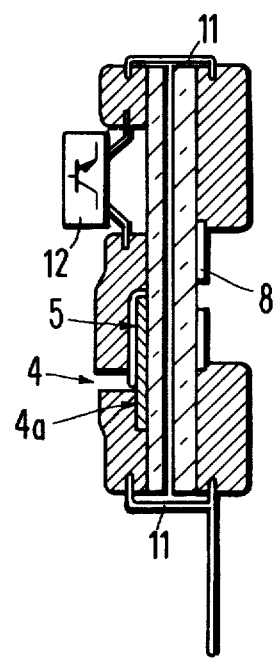
FIG. 4 is an end cross-sectional view showing a soldered RC network with an active component and contact elements.

The R network (FIG. 1) and the C network (FIG. 2) with the sides on which in each case the substrate 1, 7 is disposed are placed in juxtaposition and held by contact elements 11 (FIG. 4). After the structure thusly mounted is covered on both sides with flux, dip soldering is performed by completely dipping both networks into an approximately 230° C. hot soldering melt consisting, for example, generally of a lead/zinc alloy for a period of about 10 seconds. In this way the contact elements 11 are soldered with the thin film contacts in one operation. Likewise, all the conductor tracks, opposing electrodes and contact areas that are still free are completely soldered in the shape of a cushion. The layer thickness is from about 100 to 200 μm. Thereafter, the soldering of an active component 12 (IC) in the ceramic enclosure is performed by reflow soldering.

The principles of the invention are described hereinabove by describing a preferred form of construction and the manner of making it. The specifically described form of construction, manufacturing steps and operating conditions are considered to be only exemplary and can be modified or changed while remaining within the scope of the invention as defined by the appended claims.

We claim:

1. A method for electrically bonding a network including at least one alpha-tantalum capacitor with another network containing at least one other component, such as a tantalum resistor network, including the steps of:

mounting said alpha-tantalum capacitor on a first non-conducting substrate having metal elements;

mounting said other component on a second non-conducting substrate having metal elements;

placing said first and second non-conducting substrates back to back so that said capacitor and said other component are remote from one another;

electrically bonding said capacitor to said other component to form a bonded network by connecting said first and second substrates together with electrical contact elements;

dipping said bonded network into a molten solder bath to form a solder coating on said metal elements of said first and second non-conducting substrates and the ends of said contact elements to interconnect said metal elements on said first and second non-conducting substrates and couple said first and second non-conducting substrates together in a back-to-back relationship.

* * * * *